United States Patent
Choi et al.

(10) Patent No.: US 9,666,731 B2
(45) Date of Patent: May 30, 2017

(54) COMPOSITION FOR SOLAR CELL ELECTRODES, ELECTRODE FABRICATED USING THE SAME, AND SOLAR CELL HAVING THE ELECTRODE

(71) Applicant: SAMSUNG SDI CO., LTD., Yongin-si, Gyeonggi-do (KR)

(72) Inventors: Young Wook Choi, Suwon-si (KR); Eun Kyung Kim, Suwon-si (KR); Ji Youn Lee, Suwon-si (KR)

(73) Assignee: SAMSUNG SDI CO., LTD., Yongin-Si, Gyeonggi-Do (KR)

( * ) Notice: Subject to any disclaimer, the term of this patent is extended or adjusted under 35 U.S.C. 154(b) by 205 days.

(21) Appl. No.: 14/510,276

(22) Filed: Oct. 9, 2014

(65) Prior Publication Data

US 2015/0107664 A1    Apr. 23, 2015

(30) Foreign Application Priority Data

Oct. 21, 2013  (KR) ......... 10-2013-0125576
Oct. 1, 2014   (KR) ......... 10-2014-0132667

(51) Int. Cl.
| | |
|---|---|
| *H01B 1/22* | (2006.01) |
| *H01L 35/14* | (2006.01) |
| *H01L 31/0224* | (2006.01) |
| *C09D 5/24* | (2006.01) |
| *H01B 1/16* | (2006.01) |

(52) U.S. Cl.
CPC ........ *H01L 31/022425* (2013.01); *C09D 5/24* (2013.01); *H01B 1/16* (2013.01); *H01B 1/22* (2013.01); *H01L 35/14* (2013.01); *Y02E 10/50* (2013.01)

(58) Field of Classification Search
CPC .... H01B 1/00; H01B 1/16; H01B 1/22; H01L 35/14
See application file for complete search history.

(56) References Cited

U.S. PATENT DOCUMENTS

2012/0061624 A1    3/2012  Jung et al.
2012/0255605 A1*  10/2012  Takeda ............... H01B 1/22
                                                136/256

(Continued)

FOREIGN PATENT DOCUMENTS

CN    102403047 A    4/2012
CN    103137240 A    6/2013

(Continued)

OTHER PUBLICATIONS

Office Action mailed Aug. 12, 2015 in corresponding Taiwanese Patent Application No. 103136220.

(Continued)

*Primary Examiner* — Mark Kopec
(74) *Attorney, Agent, or Firm* — Lee & Morse, P.C.

(57) ABSTRACT

A composition for solar cell electrodes, an electrode fabricated using the same, and a solar cell including the electrode, the composition including a conductive powder; a glass frit; and an organic vehicle, wherein the conductive powder includes silver powder and aluminum powder, the silver powder includes silver particles having an average particle size D50 of 1.5 μm or more in an amount of 50 wt % or more, based on a total weight of the silver powder.

11 Claims, 1 Drawing Sheet

(56) References Cited

U.S. PATENT DOCUMENTS

| | | | |
|---|---|---|---|
| 2013/0134363 A1* | 5/2013 | Song | H01B 1/22 252/513 |
| 2013/0139873 A1* | 6/2013 | Choi | H01B 1/22 136/252 |
| 2013/0186463 A1 | 7/2013 | Wang et al. | |
| 2015/0357489 A1* | 12/2015 | Konig | C03C 8/18 136/244 |

FOREIGN PATENT DOCUMENTS

| | | |
|---|---|---|
| CN | 103137242 A | 6/2013 |
| JP | 2010-87131 A | 4/2010 |
| KR | 10-2006-0108552 A | 10/2006 |
| KR | 10-2012-0084045 A | 7/2012 |
| KR | 10-2013-0013993 A | 2/2013 |
| KR | 10-2013-0058569 A | 6/2013 |
| TW | 200727503 A | 7/2007 |
| TW | 201108249 A1 | 3/2011 |

OTHER PUBLICATIONS

Office Action mailed Mar. 31, 2016 in corresponding Chinese Patent Application No. 201410544887.0, No English translation.
Korean Office Action dated Aug. 2, 2016 in Corresponding Korean Patent Application No. 10-2014-0132667.

* cited by examiner

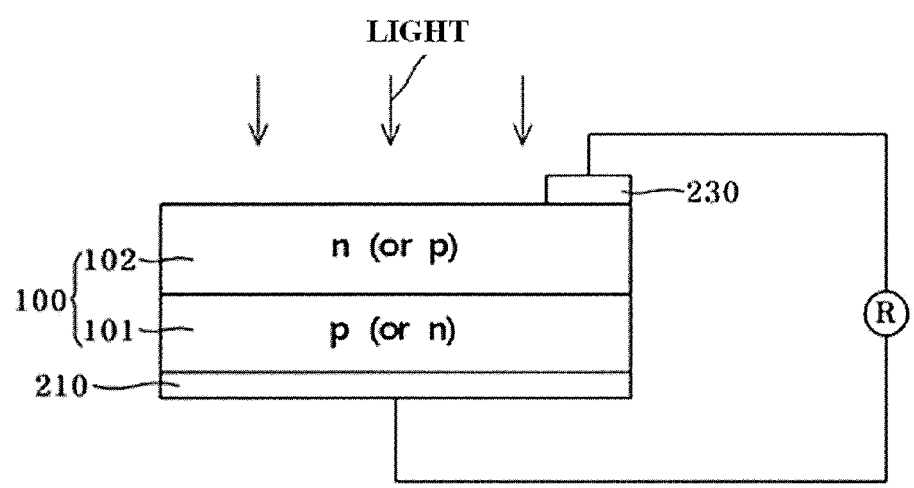

COMPOSITION FOR SOLAR CELL ELECTRODES, ELECTRODE FABRICATED USING THE SAME, AND SOLAR CELL HAVING THE ELECTRODE

CROSS-REFERENCE TO RELATED APPLICATION

Korean Patent Application No. 10-2013-0125576, filed on Oct. 21, 2013, Korean Patent Application No. 10-2014-0132667, filed on Oct. 1, 2014, in the Korean Intellectual Property Office, and entitled: "Composition for Solar Cell Electrodes, Electrode Fabricated Using the Same, and Solar Cell Having the Electrode," is incorporated by reference herein in its entirety.

BACKGROUND

1. Field

Embodiments relate to a composition for solar cell electrodes, electrodes fabricated using the same, and solar cells including the electrodes.

2. Description of the Related Art

Solar cells generate electricity using the photovoltaic effect of a p-n junction, which converts photons of light, e.g., sunlight, into electricity. In the solar cell, front and rear electrodes may be formed on upper and lower surfaces of a semiconductor wafer or substrate having the p-n junctions, respectively. Then, the photovoltaic effect at the p-n junction may be induced by light, e.g., sunlight, entering the semiconductor wafer, and electrons generated by the photovoltaic effect at the p-n junction may provide electric current to the outside through the electrodes. The electrodes of the solar cell may be formed on the wafer by, e.g., applying, patterning, and baking an electrode composition.

SUMMARY

Embodiments are directed to a composition for solar cell electrodes, electrodes fabricated using the same, and solar cells including the electrodes.

The embodiments may be realized by providing a composition for solar cell electrodes, the composition including a conductive powder; a glass frit; and an organic vehicle, wherein the conductive powder includes silver powder and aluminum powder, the silver powder includes silver particles having an average particle size D50 of 1.5 μm or more in an amount of 50 wt % or more, based on a total weight of the silver powder.

The silver powder may include at least two groups of silver particles having different average particle sizes D50, and may have an average particle size D50 of about 1.5 μm or more, as calculated by Equation 1:

$$D50=\{(X1*Y1)+(X2*Y2)+\ldots+(Xn*Yn)\}/\{X1+X2+\ldots+Xn\}, \quad (1)$$

wherein, in Equation 1, $X1$ is an amount of a first silver particle group in wt %, $X2$ is an amount of a second silver particle group in wt %, $Xn$ is an amount of an $n^{th}$ silver particle group in wt %, $Y1$ is an average particle size D50 of the first silver particle group, $Y2$ is an average particle size D50 of the second silver particle group, and $Yn$ is an average particle size D50 of the $n^{th}$ silver particle group.

The silver powder may include silver particles having an average particle size D90 of about 2.4 μm or more in an amount of about 10 wt % or more, based on the total weight of the silver powder, the average particle size D90 being calculated by Equation 2:

$$D90=\{(X1*Z1)+(X2*Z2)+\ldots+(Xn*Zn)\}/\{X1+X2+\ldots+Xn\} \quad (2),$$

wherein, in Equation 2, $X1$ is the amount of the first silver particle group in wt %, $X2$ is the amount of the second silver particle group in wt %, $Xn$ is the amount of the $n^{th}$ silver particle group in wt %, $Z1$ is an average particle size D90 of the first silver particle group, $Z2$ is an average particle size D90 of the second silver particle group, and $Zn$ is an average particle size D90 of the $n^{th}$ silver particle group.

The conductive powder may include the aluminum powder and the silver powder in a weight ratio of the aluminum powder to the silver powder of about 1:30 to about 1:45.

The glass frit may be a boron oxide-bismuth oxide glass frit or a lead oxide-boron oxide-bismuth oxide glass frit, the boron oxide being present in the glass frit in an amount of about 1 wt % to about 30 wt %, based on a total weight of the glass frit.

The glass frit may further include one or more of tellurium oxide, lithium oxide, zinc oxide, phosphorus oxide, silicon oxide, magnesium oxide, cerium oxide, strontium oxide, molybdenum oxide, titanium oxide, tin oxide, indium oxide, vanadium oxide, barium oxide, nickel oxide, copper oxide, sodium oxide, potassium oxide, antimony oxide, germanium oxide, gallium oxide, calcium oxide, arsenic oxide, cobalt oxide, zirconium oxide, manganese oxide, aluminum oxide, or tungsten oxide.

The composition may include about 60 wt % to about 95 wt % of the conductive powder; about 0.5 wt % to about 20 wt % of the glass frit; and about 1 wt % to about 30 wt % of the organic vehicle, all based on a total weight of the composition.

The glass frit may be present in the composition in an amount of about 0.5 wt % to about 3.5 wt %, based on the total weight of the composition.

The glass frit may have an average particle size D50 of about 0.1 μm to about 10 μm.

The composition may further include one or more of a dispersant, a thixotropic agent, a plasticizer, a viscosity stabilizer, an anti-foaming agent, a pigment, a UV stabilizer, an antioxidant, or a coupling agent.

The embodiments may be realized by providing a solar cell electrode prepared from the composition for solar cell electrodes according to an embodiment.

The embodiments may be realized by providing a solar cell including a wafer, the wafer including a p-type substrate, and an n-type emitter on one side of the p-type substrate; a front electrode on the n-type emitter; and a rear electrode on another side of the p-type substrate, wherein the front electrode is formed from the composition for solar cell electrodes according to an embodiment.

The embodiments may be realized by providing a solar cell including a wafer, the wafer including an n-type substrate, and a p-type emitter on one side of the n-type substrate; a front electrode on the p-type emitter; and a rear electrode on another side of the n-type substrate, wherein at least one of the front electrode and the rear electrode is formed from the composition for solar cell electrodes according to an embodiment.

BRIEF DESCRIPTION OF THE DRAWING

Features will be apparent to those of skill in the art by describing in detail exemplary embodiments with reference to the attached drawing in which:

FIG. 1 illustrates a schematic side view of a solar cell in accordance with one embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. Like reference numerals refer to like elements throughout.

Composition for Solar Cell Electrodes

A composition for solar cell electrodes according to an embodiment may include a conductive powder; a glass frit; and an organic vehicle. The conductive powder may include silver (Ag) powder and aluminum (Al) powder. The silver powder may include silver particles that have an average particle size D50 of about 1.5 μm or more in an amount of about 50 wt % or more, based on the total weight of the silver powder. For example, about 50 wt % or more of silver particles in the silver powder may have an average particle size D50 of about 1.5 μm or more.

As used herein, average particle sizes D10, D50, and D90 refer particle sizes (diameter) at volume ratios of 10%, 50%, and 90% on a cumulative size-distribution curve, respectively.

Now, each component of the composition for solar cell electrodes according to an embodiment will be described in more detail.

(A) Conductive Powder

The composition for solar cell electrodes according to an embodiment may include silver (Ag) powder and aluminum (Al) powder as a conductive powder.

The particle sizes of the silver powder and the aluminum powder may be on a nanometer or micrometer scale.

The silver powder may include at least two different silver particle groups, e.g., may include 2 to 1,000 different silver particle groups having different particle sizes according to size distribution.

In an implementation, the silver powder (e.g., including all of the groups) may include silver particles having an average particle size D50 of about 1.5 μm or more in an amount of about 50 wt % or more, e.g., from about 50 wt % to about 80 wt %, based on the total weight of the silver powder. Using a mixture of the silver powder and the aluminum powder under the conditions mentioned above may help lower a baking temperature, as compared with using the silver powder alone, since the aluminum powder may provide a low eutectic point to the mixture. Furthermore, using a mixture of the silver powder and the aluminum powder under the conditions mentioned above may provide adjustability in relation to a degree of etching on an anti-reflection film by the glass frit, as described below, while maximizing solubility of aluminum into the glass, thereby allowing for minimized contact resistance.

In an implementation, the silver powder may include silver particles having an average particle size D50 of about 2.4 μm or more in an amount of about 50 wt % or more, based on the total weight of the silver powder. In this case, the composition may further reduce contact resistance.

When the silver powder includes first to $n^{th}$ silver particle groups having different average particle sizes, the average particle size D50 of the silver powder may be calculated by Equation 1, below.

$$D50=\{(X1*Y1)+(X2*Y2)+\ldots+(Xn*Yn)\}/\{X1+X2+\ldots+Xn\}$$

In Equation 1,

X1 is the amount of the first silver particle group in wt %,

X2 is the amount of the second silver particle group in wt %,

Xn is the amount of the $n^{th}$ silver particle group in wt %,

Y1 is an average particle size D50 of the first silver particle group,

Y2 is an average particle size D50 of the second silver particle group, and

Yn is an average particle size D50 of the $n^{th}$ silver particle group.

In Equation 1, n may range from 2 to 100, e.g., from 2 to 10. In an implementation, n may range from 2 to 5.

In an implementation, the silver powder may include silver particles having an average particle size D90 of about 2.4 μm or more. In this case, the silver particles having an average particle size D90 of about 2.4 μm or more may be present in an amount of about 10 wt % or more, e.g. from about 10 wt % to about 80 wt %, based on the total weight of the silver powder.

When the silver powder includes first to $n^{th}$ silver particle groups having different particle sizes, the average particle size D90 of the silver powder may be calculated by Equation 2, below.

$$D90=\{(X1*Z1)+(X2*Z2)+\ldots+(Xn*Zn)\}/\{X1+X2+\ldots+Xn\}$$

In Equation 2,

X1 is the amount of the first silver particle group in wt %,

X2 is the amount of the second silver particle group in wt %,

Xn is the amount of the $n^{th}$ silver particle group in wt %,

Z1 is an average particle size D90 of the first silver particle group,

Z2 is an average particle size D90 of the second silver particle group, and

Zn is an average particle size D90 of the $n^{th}$ silver particle group.

The average particle size (D50 or D90) may be measured using, e.g., a Model 1064D (CILAS Co., Ltd.), after dispersing the conductive powder in isopropyl alcohol (IPA) at 25° C. for 3 minutes via ultrasonication.

The composition for solar cell electrodes according to an embodiment may include the conductive powder in an amount of about 60 wt % to about 95 wt %, based on the total weight of the composition. Within this range, the composition may help prevent deterioration in conversion efficiency of electrodes caused by an increase in resistance. In an implementation, the conductive powder may be present in an amount of about 70 wt % to about 90 wt %. In an implementation, the conductive powder may include the aluminum powder and the silver powder in a weight ratio of the aluminum powder to the silver powder of about 1:30 to about 1:45. Within this range, the conductive powder may have a wider range of optimum baking temperatures according to the eutectic temperature, thereby providing enhanced processing properties and minimized contact resistance.

(B) Glass Frit

The glass frit may help enhance adhesion between the conductive powder and the wafer and form silver crystal grains in an emitter region by etching an anti-reflection layer and melting the conductive powder so as to reduce resistance during the baking process of the composition for electrodes. Further, during the baking process, the glass frit may soften and may decrease the baking temperature.

When the sheet resistance of the solar cell is increased in order to help improve solar cell conversion efficiency, an increase in contact resistance and current leakage of the solar cell may occur. Thus, it may be advantageous to minimize both serial resistance (Rs) and damage on the p-n junction, while maximizing open circuit voltage Voc. In addition, as the baking temperature varies in a broad range with increasing use of various wafers having different sheet resistances, it may be desirable that the glass frit secure sufficient thermal stability to withstand a wide range of baking temperatures.

In an implementation, the glass frit may be a boron oxide-bismuth oxide-based ($B_2O_3$—$Bi_2O_3$) glass frit, or a lead oxide-boron oxide-bismuth oxide-based (PbO—$B_2O_3$—$Bi_2O_3$) glass frit. In an implementation, the boron oxide ($B_2O_3$) may be present in the glass frit in an amount of about 1 wt % to about 30 wt %, e.g., about 10 wt % to about 25 wt %, based on a total weight of the glass frit. In an implementation, the bismuth oxide ($Bi_2O_3$) may be present in an amount of about 30 wt % to about 80 wt %, e.g., about 35 wt % to about 78 wt %, in the glass frit. Within this range, the glass frit may help provide excellent conversion efficiency.

In an implementation, the glass frit may further include at least one metal oxide selected from the group of tellurium oxide ($TeO_2$), lithium oxide ($Li_2O$), zinc oxide (ZnO), phosphorus oxide ($P_2O_5$), silicon oxide ($SiO_2$), magnesium oxide (MgO), cerium oxide ($CeO_2$), strontium oxide (SrO), molybdenum oxide ($MoO_3$), titanium oxide ($TiO_2$), tin oxide (SnO), indium oxide ($In_2O_3$), vanadium oxide ($V_2O_5$), barium oxide (BaO), nickel oxide (NiO), copper oxide ($Cu_2O$ or CuO), sodium oxide ($Na_2O$), potassium oxide ($K_2O$), antimony oxide ($Sb_2O_3$, $Sb_2O_4$, or $Sb_2O_5$), germanium oxide ($GeO_2$), gallium oxide ($Ga_2O_3$), calcium oxide (CaO), arsenic oxide ($As_2O_3$), cobalt oxide (CoO, or $Co_2O_3$), zirconium oxide ($ZrO_2$), manganese oxide (MnO, $Mn_2O_3$, or $Mn_3O_4$), aluminum oxide ($Al_2O_3$), and tungsten oxide ($WO_3$).

The glass frit may be prepared from the foregoing metal oxides by a suitable method. For example, the metal oxides may be mixed in a predetermined ratio. Mixing may be carried out using a ball mill or a planetary mill. The mixture may be melted at 900° C. to 1,300° C., followed by quenching to 25° C. The obtained resultant may be subjected to pulverization using a disc mill, a planetary mill, or the like, thereby preparing a glass frit.

The glass frit may have an average particle size D50 of about 0.1 μm to about 10 μm, and may have a spherical or amorphous shape.

The glass frit may be present in an amount of about 0.5 wt % to about 20 wt %, e.g., about 0.5 wt % to about 3.5 wt %, based on the total weight of the composition.

(C) Organic Vehicle

The organic vehicle may impart suitable viscosity and rheological characteristics for printing to the composition for solar cell electrodes through mechanical mixing with the inorganic component of the composition.

The organic vehicle may be a suitable organic vehicle used in compositions for solar cell electrodes, and may include a binder resin, a solvent, or the like.

The binder resin may be selected from acrylate resins or cellulose resins. In an implementation, ethyl cellulose may be used as the binder resin. In an implementation, the binder resin may be selected from among ethyl hydroxyethyl cellulose, nitrocellulose, blends of ethyl cellulose and phenol resins, alkyd resins, phenol resins, acrylate ester resins, xylene resins, polybutane resins, polyester resins, urea resins, melamine resins, vinyl acetate resins, wood rosin, polymethacrylates of alcohols, or the like. The solvent may be selected from the group of, e.g., hexane, toluene, ethyl cellosolve(ethylene glycol monoethyl ether), cyclohexanone, butyl cellosolve(ethylene glycol monobutyl ether), butyl carbitol (diethylene glycol monobutyl ether), dibutyl carbitol (diethylene glycol dibutyl ether), butyl carbitol acetate (diethylene glycol monobutyl ether acetate), propylene glycol monomethyl ether, hexylene glycol, terpineol, methylethylketone, benzylalcohol, γ-butyrolactone, ethyl lactate, and combinations thereof.

The organic vehicle may be present in the composition in an amount of about 1 wt % to about 30 wt %, e.g., about 5 wt % to about 15 wt %, based on the total weight of the composition. Within this range, the organic vehicle may help provide sufficient adhesive strength and excellent printability to the composition.

(D) Additives

In an implementation, the composition may further include a suitable additive, as desired, to help enhance flow properties, processing properties, and stability. The additive may include, e.g., dispersants, thixotropic agents, plasticizers, viscosity stabilizers, anti-foaming agents, pigments, UV stabilizers, antioxidants, or coupling agents. These additives may be used alone or as mixtures thereof. These additives may be present in the composition in an amount of, e.g., about 0.1 wt % to about 5 wt %.

Solar Cell Electrode and Solar Cell Including the Same

Other embodiments provide electrodes formed of the composition for solar cell electrodes and a solar cell including the same.

In an implementation, a solar cell may include a wafer (that includes a p-type substrate and an n-type emitter on a surface of the p-type substrate); a front electrode on the n-type emitter; and a rear electrode on another side of the p-type substrate. The front electrode may be formed from the composition for solar cell electrodes described above, and the rear electrode may be formed from aluminum paste. The n-type emitter may be formed by doping impurities of an element from Group V, e.g. antimony (Sb), arsenic (As), phosphorus (P) or the like, onto a surface of the p-type substrate.

Referring to FIG. 1, a front electrode (P+ electrode) 230 may be formed by printing and baking the composition on a wafer 100 that includes a p-type substrate 101 and an n-type emitter 102, and a rear electrode 210 may be formed by applying and baking the aluminum paste on the rear side of the wafer.

In an implementation, a solar cell may include a wafer (that includes an n-type substrate and a p-type emitter on a surface of the n-type substrate); a front electrode on the p-type emitter; and a rear electrode on another side of the n-type substrate. At least one of the front electrode and the rear electrode may be formed from the composition for solar cell electrodes described above. The p-type emitter may be formed by doping impurities of an element from Group 3, e.g., boron (B), gallium (Ga) or indium (In), onto a surface of the n-type substrate.

Referring to FIG. 1 again, a rear electrode 210 and a front electrode (N+ electrode) 230 may be formed by printing and baking the composition on a wafer 100 that includes an n-type substrate 101 and a p-type emitter 102. For example, a preliminary process of preparing the rear electrode 210 may be performed by printing the composition for solar cell electrodes on the rear side of the wafer 100 and drying the printed composition at about 200° C. to about 400° C. for about 10 seconds to about 60 seconds. Further, a preliminary process for preparing the front electrode 230 may be performed by printing the composition for solar cell electrodes on the front surface of the wafer and drying the printed composition.

Then, the front electrode 230 and the rear electrode 210 may be formed by baking the wafer at about 400° C. to about 850° C., e.g., at about 600° C. to about 750° C., based on measured temperature, for about 30 seconds to about 60 seconds.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Composition in Examples (A1) Silver Powder
Silver powder having size-distributions as listed in Table 1, below, was used.

TABLE 1

| Particle group | Size distribution (μm) | | | Manufacturer & Product name |
|---|---|---|---|---|
| | D10 | D50 | D90 | |
| (A11) | 0.8 | 1.2 | 2.0 | DOWA Co., Ltd. 2.5-8F |
| (A12) | 1.0 | 1.4 | 2.2 | DOWA Co., Ltd. 3-11F |
| (A13) | 1.2 | 1.8 | 2.8 | DOWA Co., Ltd. 4-11F |
| (A14) | 1.6 | 2.8 | 4.3 | DOWA Co., Ltd. 5-11F |

(A2) Aluminum Powder
Aluminum powder having an average particle size D50 of 4.6 μm (Yuanyang Co., Ltd.) was used.
(B) Glass Frit
Glass fits having compositions as listed in Table 2, below, were used.

TABLE 2

| | Composition of Glass frit (wt %) | | |
|---|---|---|---|
| | PbO | $B_2O_3$ | $Bi_2O_3$ |
| (B1) | 40 | 20 | 40 |
| (B2) | 0 | 23 | 77 |
| (B3) | 30 | 40 | 30 |

Organic vehicle (Binder):
Ethylcellulose (STD4, Dow Chemical Company) was used.
Organic vehicle (Solvent):
Butyl carbitol was used.

Examples 1 to 4 & Comparative Examples 1 to 2

As an organic binder, ethylcellulose (STD4, Dow Chemical Company) was sufficiently dissolved in butyl carbitol at 60° C., and silver powder (AG-4-8, Dowa Hightech Co., Ltd) as listed in Table 1, aluminum powder, and glass frits having an average particle size D50 of 2 μm in Table 2 were added to the binder solution in amounts as listed in Table 3, followed by mixing and kneading in a 3-roll kneader, thereby preparing a composition for solar cell electrodes.

In order to implement or measure contact resistance of the P+ electrode, aluminum paste was applied to the rear side of a p-type substrate (80Ω, single crystal form) doped with $POCl_3$, followed by printing and drying. In addition, the compositions for solar cell electrodes prepared in the Examples and Comparative Examples were printed in 50 μm width and 325 mesh on the front side of the substrate and then dried, followed by baking at a belt speed of 250 ipm in 6 zones in a BTU drying oven (setting temperature: 820° C.).

In order to implement or measure contact resistance of the N+ electrode, the compositions for solar cell electrodes prepared according to Examples and Comparative Examples were printed in a width of 50 μm and 325 mesh on the front side of an n-type substrate (70Ω, single crystal form) doped with boron, and then dried, followed by baking at a belt speed of 250 ipm in 6 zones in a BTU drying oven (setting temperature: 900° C.). In addition, the composition for electrodes prepared in the Examples and Comparative Examples were printed on the rear side of the substrate and dried in the same manner as above. Then, the resulting cells were cut into 6 mm wide and 60 mm long pieces using a laser scriber, followed by measuring the contact resistances of the pieces.

Cells formed according to this procedure were evaluated as to serial resistance (Rs) and conversion efficiency (%) using a solar cell efficiency tester CT-801 (Pasan Co., Ltd.), and as to contact resistance (Rc) using a 4-point probe (NS Tech Co., Ltd.). Results are shown in Table 3, below.

TABLE 3

| | | Example 1 | Example 2 | Example 3 | Example 4 | Comparative Example 1 | Comparative Example 2 |
|---|---|---|---|---|---|---|---|
| Silver powder | (A11) | 33 | 33 | 33 | 33 | 33 | 33 |
| | (A12) | — | — | — | — | 52 | 52 |
| | (A13) | 52 | 42 | — | — | — | — |
| | (A14) | — | 10 | 52 | 52 | — | — |
| Aluminum powder (A2) | | 2 | 2 | 2 | 2 | 2 | 2 |
| Glass frit | (B1) | 2.5 | 2.5 | 2.5 | — | 2.5 | — |
| | (B2) | — | — | — | 2.5 | — | — |
| | (B3) | — | — | — | — | — | 2.5 |

TABLE 3-continued

|  |  | Example 1 | Example 2 | Example 3 | Example 4 | Comparative Example 1 | Comparative Example 2 |
|---|---|---|---|---|---|---|---|
| Organic vehicle | Binder | 2 | 2 | 2 | 2 | 2 | 2 |
|  | Solvent | 8.5 | 8.5 | 8.5 | 8.5 | 8.5 | 8.5 |
| Average particle size of silver powder (μm) | D50 | 1.57 | 1.68 | 2.18 | 2.18 | 1.32 | 1.32 |
|  | D90 | 2.49 | 2.67 | 3.41 | 3.41 | 2.12 | 2.12 |
| Serial resistance (mΩ) |  | 5.4 | 5.1 | 4.5 | 4.3 | 6.4 | 9.0 |
| Efficiency (%) |  | 17.69 | 17.75 | 17.92 | 18.26 | 14.56 | 10.76 |
| Contact resistance (Ω) | N/P + electrode | 2.5 | 1.2 | 0.5 | 0.3 | 24.6 | 27.1 |
|  | N/N + electrode | 8.8 | 4.3 | 3.3 | 2.9 | 14.4 | 26.2 |

As shown in Table 3, it may be seen that the solar cell electrodes fabricated using the compositions of Examples 1 to 4, which were prepared using silver particles having an average particle size D50 of about 1.5 μm or more in an amount of about 50 wt % or more, based on the total weight of the silver powder, had low serial resistance and contact resistance, thereby providing excellent conversion efficiency, as compared with those of Comparative Examples 1 to 2, which were prepared using silver particles having an average particle size D50 less than about 1.5 μm. In addition, it may be seen that the solar cell electrodes fabricated using the compositions prepared in Comparative Example 2, in which boron oxide was present in an amount more than about 30 wt % in the glass frit, had high serial resistance and contact resistance, thereby causing deterioration in conversion efficiency.

By way of summation and review, a baking type composition for solar cell electrodes may vary in optimum baking conditions, depending upon variances (e.g., sheet resistance/thickness of an emitter, thickness of an anti-reflection film deposited by plasma chemical vapor deposition, and surface irregularity in a texturing process) in a manufacturing process of a wafer. In order to help improve average efficiency, a composition for solar cell electrodes may have a wide range of optimum baking temperatures.

In manufacture of a crystalline silicon-based solar cell, the optimum baking temperature may vary depending upon, e.g., surface treatment of a silicon substrate, formation of an anti-reflection film, irregularity in sheet resistance and thickness of an emitter layer. Changes in optimum baking temperature according to variation in an original wafer may increase variance in solar cell efficiency, thereby causing deterioration in efficiency of solar cells.

Solar cell efficiency may be improved by minimizing changes in optimum baking conditions caused by variation in an original wafer and process conditions, e.g., compositional design of glass frits may provide a wide range of baking temperature.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A composition for solar cell electrodes, the composition comprising:
   a conductive powder;
   a glass frit, the glass frit being a boron oxide-bismuth oxide glass frit or a lead oxide-boron oxide-bismuth oxide glass frit in which the boron oxide is present in the glass frit in an amount of about 1 wt % to about 30 wt %, based on a total weight of the glass frit; and
   an organic vehicle,
   wherein:
   the conductive powder includes silver powder and aluminum powder,
   the silver powder includes at least two groups of silver particles having different average particle sizes,
   the silver powder includes particles having an average particle size D50 of about 1.5 μm or more in an amount of 50 wt % to 80 wt %, based on a total weight of the silver powder, and
   the silver powder has an average particle size D50 of about 1.5 μm or more, as calculated by Equation 1:

$$D50=\{(X1*Y1)+(X2*Y2)+\ldots+(Xn*Yn)\}/\{X1+X2+\ldots+Xn\},$$

wherein, in Equation 1,
   X1 is an amount of a first silver particle group in wt %,
   X2 is an amount of a second silver particle group in wt %,
   Xn is an amount of an $n^{th}$ silver particle group in wt %,
   Y1 is an average particle size D50 of the first silver particle group,
   Y2 is an average particle size D50 of the second silver particle group, and
   Yn is an average particle size D50 of the $n^{th}$ silver particle group.

2. The composition for solar cell electrodes as claimed in claim 1, wherein the silver powder includes silver particles having an average particle size D90 of about 2.4 μm or more in an amount of about 10 wt % or more, based on the total weight of the silver powder, the average particle size D90 being calculated by Equation 2:

$$D90=\{(X1*Z1)+(X2*Z2)+\ldots+(Xn*Zn)\}/\{X1+X2+\ldots+Xn\} \quad (2),$$

wherein, in Equation 2,
   X1 is the amount of the first silver particle group in wt %,
   X2 is the amount of the second silver particle group in wt %,
   Xn is the amount of the $n^{th}$ silver particle group in wt %,
   Z1 is an average particle size D90 of the first silver particle group,
   Z2 is an average particle size D90 of the second silver particle group, and Zn is an average particle size D90 of the $n^{th}$ silver particle group.

3. The composition for solar cell electrodes as claimed in claim 1, wherein the conductive powder includes the aluminum powder and the silver powder in a weight ratio of the aluminum powder to the silver powder of about 1:30 to about 1:45.

4. The composition for solar cell electrodes as claimed in claim 1, wherein the glass frit further includes one or more of tellurium oxide, lithium oxide, zinc oxide, phosphorus oxide, silicon oxide, magnesium oxide, cerium oxide, strontium oxide, molybdenum oxide, titanium oxide, tin oxide, indium oxide, vanadium oxide, barium oxide, nickel oxide, copper oxide, sodium oxide, potassium oxide, antimony oxide, germanium oxide, gallium oxide, calcium oxide, arsenic oxide, cobalt oxide, zirconium oxide, manganese oxide, aluminum oxide, or tungsten oxide.

5. The composition for solar cell electrodes as claimed in claim 1, wherein the composition includes:
   about 60 wt % to about 95 wt % of the conductive powder;
   about 0.5 wt % to about 20 wt % of the glass fit; and
   about 1 wt % to about 30 wt % of the organic vehicle, all based on a total weight of the composition.

6. The composition for solar cell electrodes as claimed in claim 1, wherein the glass fit is present in the composition in an amount of about 0.5 wt % to about 3.5 wt %, based on the total weight of the composition.

7. The composition for solar cell electrodes as claimed in claim 1, wherein the glass frit has an average particle size D50 of about 0.1 μm to about 10 μm.

8. The composition for solar cell electrodes as claimed in claim 1, further comprising one or more of a dispersant, a thixotropic agent, a plasticizer, a viscosity stabilizer, an anti-foaming agent, a pigment, a UV stabilizer, an antioxidant, or a coupling agent.

9. A solar cell electrode prepared from the composition for solar cell electrodes as claimed in claim 1.

10. A solar cell, comprising:
   a wafer, the wafer including:
      a p-type substrate, and
      an n-type emitter on one side of the p-type substrate;
   a front electrode on the n-type emitter; and
   a rear electrode on another side of the p-type substrate,
   wherein the front electrode is formed from the composition for solar cell electrodes as claimed in claim 1.

11. A solar cell, comprising:
   a wafer, the wafer including:
      an n-type substrate, and
      a p-type emitter on one side of the n-type substrate;
   a front electrode on the p-type emitter; and
   a rear electrode on another side of the n-type substrate,
   wherein at least one of the front electrode and the rear electrode is formed from the composition for solar cell electrodes as claimed in claim 1.

* * * * *